United States Patent
Gill

(10) Patent No.: US 7,502,211 B2
(45) Date of Patent: Mar. 10, 2009

(54) MTJ DEVICE WITH PARTIALLY MILLED ANTI-PARALLEL COUPLED BOTTOM FREE LAYER

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 519 days.

(21) Appl. No.: 11/340,222

(22) Filed: Jan. 26, 2006

(65) Prior Publication Data

US 2007/0171570 A1 Jul. 26, 2007

(51) Int. Cl.
G11B 5/39 (2006.01)
(52) U.S. Cl. .................................... 360/324.2
(58) Field of Classification Search ............... 360/324.2
See application file for complete search history.

(56) References Cited

U.S. PATENT DOCUMENTS

| | | | | |
|---|---|---|---|---|
| 6,466,419 | B1 * | 10/2002 | Mao | 360/324.12 |
| 6,680,832 | B2 * | 1/2004 | Fontana et al. | 360/324.2 |
| 6,741,433 | B1 | 5/2004 | Nishioka | 360/324.2 |
| 6,780,524 | B2 * | 8/2004 | Lin et al. | 428/814 |
| 6,807,034 | B2 | 10/2004 | Hasegawa et al. | 360/314 |
| 6,893,740 | B2 | 5/2005 | Saito | 428/668 |
| 6,930,866 | B2 * | 8/2005 | Jayasekara | 360/324.2 |
| 7,043,823 | B2 * | 5/2006 | Childress et al. | 29/603.07 |
| 2003/0197987 | A1 | 10/2003 | Saito | 360/324.12 |
| 2003/0231437 | A1 | 12/2003 | Chidress et al. | 360/324.12 |
| 2004/0106012 | A1 | 6/2004 | Hasegawa | 428/811.5 |
| 2004/0114284 | A1 | 6/2004 | Rachid et al. | 360/324.11 |
| 2004/0214353 | A1 | 10/2004 | Nishiyama et al. | 438/3 |
| 2005/0002131 | A1 | 1/2005 | Gill | 360/324.12 |
| 2005/0013061 | A1 | 1/2005 | Gill | 360/324.11 |

FOREIGN PATENT DOCUMENTS

JP 2004179250 6/2004

OTHER PUBLICATIONS

Y. Jiang, S. Abe, T. Nozaki, N. Tezuka, K. Inomata, "Influence of Synthetic Antiferromagnet Free Layer on Current-Perpendicular-to-Plane Spin-Valves", IEEE Transactions on Magnetic, vol. 40, No. 4, Jul. 2004, pp. 2245-2247.
Yoshiyuki Fukumoto, Atsushi Kamijo, "Effect of Milling Depth of the Junction Pattern on Magnetic Properties and Yields in Magnetic Tunnel Junctions", Jpn. J. Appl. Phys. vol. 41, Part 2, No. 2B, Feb. 15, 2002, pp. L183-L185.

* cited by examiner

Primary Examiner—Mark Blouin
(74) Attorney, Agent, or Firm—John L. Rogitz

(57) ABSTRACT

In a magnetic tunnel junction (MTJ) device having a pinned layer and upper and lower antiparallel-coupled free sublayers, to avoid loss in tunnel magnetoresistance, etching or milling of the free sublayer layer materials is stopped in the lower free sublayer. The total thickness of the free sublayers may be large to ease manufacture because the effective magnetic thickness of the free layer combination may be as small as desired by appropriately establishing a small difference between the thicknesses of the AP-coupled free sublayers. A contiguous hard bias material is centered on the free sublayers for stabilization.

19 Claims, 2 Drawing Sheets

MTJ DEVICE WITH PARTIALLY MILLED ANTI-PARALLEL COUPLED BOTTOM FREE LAYER

FIELD OF THE INVENTION

The present invention generally relates to magnetoresistive devices, such as magnetic tunnel junction (MTJ) devices for, e.g., disk drive read heads.

BACKGROUND OF THE INVENTION

In magnetic disk drives, data is written and read by magnetic transducers called "heads." The magnetic disks are rotated at high speeds, producing a thin layer of air called an air bearing surface (ABS). The read and write heads are supported over the rotating disk by the ABS, where they either induce or detect flux on the magnetic disk, thereby either writing or reading data. Layered thin film structures are typically used in the manufacture of read and write heads. In write heads, thin film structures provide high areal density, which is the amount of data stored per unit of disk surface area, and in read heads they provide high resolution.

The present invention is directed generally to devices that can be used, in some implementations, as heads for disk drives, and more particularly the present invention is directed to magnetic tunnel junction (MTJ) devices. An MTJ device has at least two metallic ferromagnetic layers separated by a very thin nonmagnetic insulating tunnel barrier layer, wherein the tunneling current perpendicularly through the layers depends on the relative orientation of the magnetizations in the two ferromagnetic layers. The high magnetoresistance at room temperature and generally low magnetic switching fields of the MTJ renders it effective for use in magnetic sensors, such as a read head in a magnetic recording disk drive, and nonvolatile memory elements or cells for magnetic random access memory (MRAM).

In a MTJ device, one of the ferromagnetic layers has its magnetization fixed, such as by being pinned by exchange coupling with an adjacent antiferromagnetic layer, and the field of the other ferromagnetic layer is "free" to rotate in the presence of an applied magnetic field in the range of interest of the read head or memory cell.

To increase both sensitivity and output, the free layer may be established by two sublayers that are separated from each other by an antiparallel coupling. (AP-coupling) layer. Since the magnetic fields of the two free sublayers are antiparallel to each other, the effective magnetic thickness of the overall free layer that is established by the two sublayers is the difference in thickness between the sublayers.

To make an AP-coupled MTJ device, a lower free sublayer is established on the barrier that overlays the above-mentioned pinned stack, then the AP-coupling layer is deposited on the first free sub-layer, then an upper free sublayer is established on the AP-coupling layer. Next, the free layers are formed into a stack by protecting only the area of the free layer sought to be maintained and ion milling the remainder away, down to the barrier covering the pinned stack.

As critically recognized herein, during the above process the barrier might be unintentionally eroded because it is difficult to stop removing material exactly as the last of the free layer intended to be removed is indeed milled away. This results in a deleterious loss of tunnel magnetoresistance between the free and pinned stacks from shunting caused by a breakdown in the barrier and/or by redeposited material.

The present invention makes the additional critical observations. As understood herein, it is necessary for stabilization purposes to provide stabilization structure in MTJ devices, and one way to do this is to surround the free stack with a hard bias material. The present invention recognizes that for optimum stabilization, when so doing the hard bias layer ideally is centered around the free stack.

With these recognitions in mind, the invention herein is provided.

SUMMARY OF THE INVENTION

A magnetic tunnel junction device includes a pinned ferromagnetic layer that has a magnetization direction substantially prevented from rotation in the presence of an applied magnetic field. An insulating tunnel barrier layer is on the pinned layer. Also, a free ferromagnetic stack is on the tunnel barrier layer and has a magnetization direction that is substantially free to rotate in the presence of an applied magnetic field. The stack includes a lower free sublayer on the barrier layer, an upper free sublayer, and an antiparallel (AP)-coupling layer between the sublayers. According to this particular aspect of the present invention, a skirt extends away from the stack against the barrier. From another aspect, no portions of the upper free sublayer or AP-coupling layer extend beyond vertical edges of the free stack, whereas the skirt, which extends radially away from the free stack, is integral to the lower free sublayer and is of the same material as the lower free sublayer, or is an oxide thereof.

In some implementations a hard bias material may be over the skirt and may surround the stack. The hard bias material is substantially centered on the free stack. The AP-coupling layer can be nonmagnetic and the free sublayers can be ferromagnetic and can be antiparallel to each other.

In another aspect, a magnetic tunnel junction device includes a ferromagnetic layer having a magnetic field pinned from rotation and upper and lower ferromagnetic sublayers not having their magnetic fields pinned from rotation and being AP-coupled together. The lower sublayer includes a skirt extending radially beyond the upper sublayer. A barrier layer is between the lower sublayer and ferromagnetic layer.

In another aspect, a method for making a MTJ device includes forming a barrier layer on a pinned stack, and forming a lower free ferromagnetic sublayer on the barrier layer. The method also includes forming an AP-coupling layer on the lower free ferromagnetic sublayer and forming an upper free ferromagnetic sublayer on the AP-coupling layer. The upper free ferromagnetic sublayer and the AP-coupling layer are etched or milled completely through, but the lower free ferromagnetic sublayer is etched or milled only part way through before stopping the etching or milling process to thereby establish a skirt on the lower free ferromagnetic sublayer that extends radially beyond the upper free ferromagnetic sublayer.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
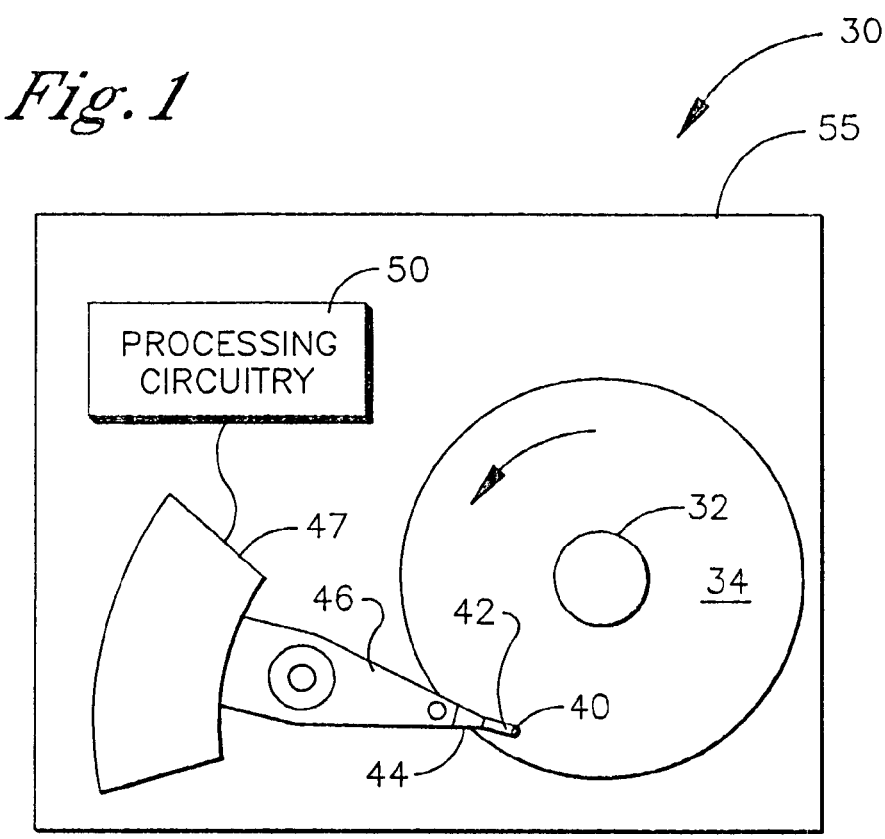
FIG. 1 is a schematic plan view of a hard disk drive, showing one non-limiting environment for the present invention.

Referring initially to FIG. 1, a magnetic disk drive 30 includes a spindle 32 that supports and rotates a magnetic disk 34. The spindle 32 is rotated by a spindle motor that is controlled by a motor controller which may be implemented in the electronics of the drive. A slider 42 has a combined read and write magnetic head 40 and is supported by a suspension 44 and actuator arm 46 that is rotatably positioned by an actuator 47. The head 40 may be a GMR or MR head or other magnetoresistive head. It is to be understood that a plurality of disks, sliders and suspensions may be employed. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin cushion of air known as the air bearing that exists between the surface of the disk 34 and an air bearing surface (ABS) of the head. The magnetic head 40 may then be employed for writing information to multiple circular tracks on the surface of the disk 34, as well as for reading information therefrom. To this end, processing circuitry 50 exchanges signals, representing such information, with the head 40, provides spindle motor drive signals for rotating the magnetic disk 34, and provides control signals to the actuator for moving the slider to various tracks. The components described above may be mounted on a housing 55.

Figure 2:
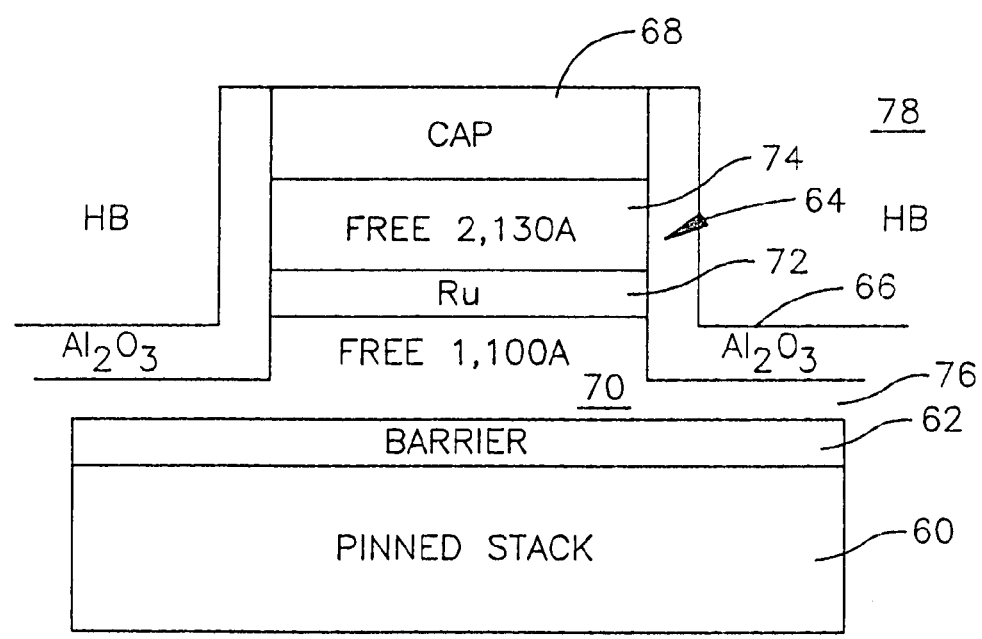
FIG. 2 is an elevational view of a non-limiting MTJ device made in accordance with the present invention.

Now referring to FIG. 2, the head 40 which is manufactured using the process of the present invention includes a pinned stack 60, it being understood that the pinned stack 60 is formed on a substrate. In non-limiting implementations the pinned stack 60 may include, in order from the substrate, a first seed layer that may be, without limitation, Ta that is twenty Angstroms thick, an optional "template" ferromagnetic layer that may be, without limitation, NiFeCr or Ru of twenty Angstroms thickness on the seed layer, a layer of antiferromagnetic material that may be, without limitation, a seventy five Angstrom thick layer of IrMn on the template layer, and a "pinned" ferromagnetic layer formed on and exchange coupled with the underlying antiferromagnetic layer. The ferromagnetic layer is called the pinned layer because its magnetization direction is prevented from rotation in the presence of applied magnetic fields in the desired range of interest for the MTJ device. Without limitation, the pinned ferromagnetic layer may be, e.g., $Co_{75}Fe_{25}$ (forty Angstroms thick)/Ru (4.5 Angstroms)/CoFeB (forty Angstroms), where the thicknesses of magnetic layers are scaled to $Ni_{81}Fe_{19}$ moment, and CoFeB is next to the barrier layer.

In addition, other conducting underlayers may without limitation include Ta, Cu and Au. Other CoFe and NiFe alloys may be used for the ferromagnetic layers and other antiferromagnetic materials may include NiMn, PtMn and IrMn. The substrate may be a silicon wafer if, for instance, the device is a memory cell, and ordinarily would be the bottom electrically conductive lead located on either the alumina gap material or the magnetic shield material on the trailing surface of the head carrier if the device is a read head.

Formed on the pinned stack 60 is a barrier layer 62 that is made of an insulating tunnel barrier material. By way of non-limiting example, the barrier layer 62 may be five to fifteen Angstroms thick and may and may be made by depositing Aluminum on the pinned stack 60 and then oxidizing it to create an $Al_2O_3$ insulating tunnel barrier layer 62. While $Al_2O_3$ may be used, a wide range of other materials may be used, including MgO, AlN, aluminum oxynitride, oxides and nitrides of gallium and indium, and bilayers and trilayers of such materials.

A free ferromagnetic stack, generally designated 64, is formed on the barrier layer 62 as shown. The free stack 64 is surrounded by an insulating layer 66 of, e.g., $Al_2O_3$ and may be covered by a protective cap 68.

In accordance with present principles, the free stack 64 includes, from the barrier layer 62, a lower free ferromagnetic sublayer 70, a non-magnetic AP-coupling layer 72 that may be made of, e.g., Ru, and an upper free ferromagnetic sublayer 74. The sublayers 70, 74 are magnetically coupled together by the AP-coupling layer 72, and are magnetically antiparallel to each other. By "free." is meant that the magnetization direction of the free stack 64 is not pinned by exchange coupling, and is thus free to rotate in the presence of applied magnetic fields in the range of interest. The free sublayers may be, without limitation, alloys of Fe and one or more of Co and Ni, or combinations thereof or may contain CoFeB.

As shown in FIG. 2, after the manufacturing process described below, a skirt portion 76 of the lower free sublayer 70 that extends radially away from the free stack 64 remains after etching, i.e., the lower free sublayer 70 is only partially etched through. In, contrast, after etching/milling no portions of the upper free sublayer 74 or AP-coupling layer 72 extend beyond the vertical edge of the free stack 64 as shown. In any case, the skirt is integral to the lower free sublayer and is of the same material as the lower free sublayer, or, as set forth further below, may be an oxide thereof.

In one non-limiting implementation, the free sublayers 70, 74 may be relatively thick (e.g., one hundred and one hundred thirty Angstroms, respectively), to render easier the stopping of the etch/mill process before completely removing the skirt 76, because the effective magnetic thickness, which is the difference in thicknesses between the sublayers 70, 74, may be made as small as desired by appropriately establishing the thicknesses of the sublayers 70, 74. Other thicknesses can be used, e.g., the lower free sublayer 70 may be thirty Angstroms thick and the upper free sublayer 74 may be sixty Angstroms thick.

The insulating layer 66 thus is deposited both around the free stack 64 and on top of the skirt 76. Further, a stabilizing hard bias material 78 is formed over the insulating layer 66, substantially centered on the free stack 64 as shown.

Figure 3:
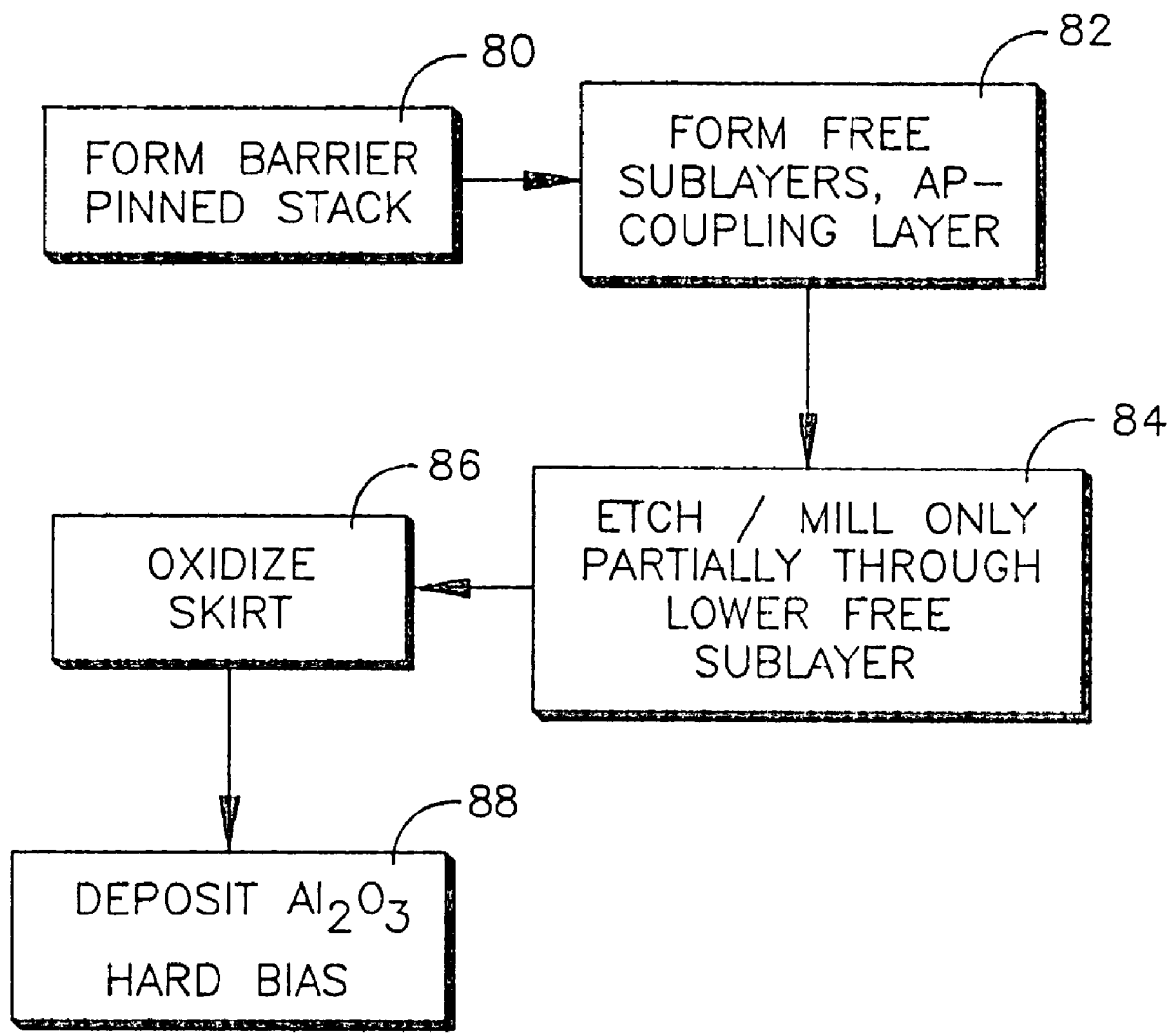
FIG. 3 is a flow chart of the method for making the device shown in FIG. 2.

Now referring to FIG. 3, at block 80 the pinned stack 60 and barrier 62 are formed on a substrate in accordance with principles known in the art, e.g., by sputtering. Proceeding to block 82, lower and upper free sublayers 70, 74 are formed with the AP-coupling layer 72 between them, likewise by sputtering or other deposition technique. Then, at block 84 the entire portions of the upper free sublayer 74 and AP-coupling layer 72 outside the free stack 64, along with only portions of the low free sublayer 70, are removed by etching (e.g., reactive ion etching) or milling (e.g., ion milling) to leave the skirt 76 of the lower free sublayer 70 as shown. The skirt 76 may be oxidized at block 86 and then the insulating layer 66 and hard bias material 78 are formed at block 88, with the hard bias material 78 substantially centered on the free stack 64 as shown.

While the particular MTJ DEVICE WITH PARTIALLY MILLED ANTI-PARALLEL COUPLED BOTTOM FREE LAYER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". It is not necessary for a device or method to address each and every problem sought to be solved by the present invention, for it to be encompassed by the present claims. Furthermore, no element, component, or method step in the present disclosure is intended to be, dedicated to the public regardless of whether the element, component, or method step is explicitly recited in the claims. Absent express definitions herein, claim terms are to be given all ordinary and accustomed meanings that are not irreconcilable with the present specification and file history.

What is claimed is:

1. A magnetic tunnel junction device comprising:
   a pinned ferromagnetic layer having a magnetization direction substantially prevented from rotation in the presence of an applied magnetic field;
   an insulating tunnel barrier layer on the pinned layer; and
   a free ferromagnetic stack on the tunnel barrier layer and having a magnetization direction substantially free to rotate in the presence of an applied magnetic field, the stack comprising:
      a lower free sublayer on the barrier layer;
      an upper free sublayer; and
      an antiparallel (AP)-coupling layer between the sublayers, wherein
   a skirt extends away from the stack against the barrier, the skirt being integral to the lower free sublayer and being the same material as the lower free sublayer, or an oxide thereof.

2. The device of claim 1, comprising a hard bias material over the skirt and surrounding the stack, the hard bias material being substantially centered on the free stack.

3. The device of claim 1, wherein the AP-coupling layer is nonmagnetic and the free sublayers are ferromagnetic and are antiparallel to each other.

4. The device of claim 1, further comprising an insulating layer between the hard bias material and the stack.

5. The device of claim 1, further comprising an insulating layer between the hard bias material and the skirt.

6. The device of claim 1, wherein no portions of the upper free sublayer or AP-coupling layer extend beyond vertical edges of the free stack.

7. The device of claim 1, comprising a hard disk drive engaged with the MTJ device.

8. A magnetic tunnel junction device comprising:
   at least one ferromagnetic layer having a magnetic field pinned from rotation;
   at least upper and lower ferromagnetic sublayers not having their magnetic fields pinned from rotation, the sublayers being AP-coupled together, the lower sublayer including a skirt extending radially beyond the upper sublayer; and
   at least one barrier layer between the lower sublayer and ferromagnetic layer.

9. The device of claim 8, comprising at least one nonmagnetic AP-coupling layer between the sublayers.

10. The device of claim 9, comprising a hard bias material over the skirt and substantially centered at least on the upper sublayer.

11. The device of claim 10, further comprising an insulating layer between the hard bias material and the sublayers.

12. The device of claim 11, further comprising an insulating layer between the hard bias material and the skirt.

13. The device of claim 12, comprising a hard disk drive engaged with the MTJ device.

14. A method for making a MTJ device, comprising:
    forming a barrier layer on a pinned stack;
    forming a lower free ferromagnetic sublayer on the barrier layer;
    forming an AP-coupling layer on the lower free ferromagnetic sublayer;
    forming an upper free ferromagnetic sublayer on the AP-coupling layer; and
    etching or milling completely through the upper free ferromagnetic sublayer and the AP-coupling layer but only partway through the lower free ferromagnetic sublayer, then stopping the etching or milling process to thereby establish a skirt on the lower free ferromagnetic sublayer that extends radially beyond the upper free ferromagnetic sublayer.

15. The method of claim 14, comprising forming a hard bias material over the skirt and substantially centered on the upper free ferromagnetic sublayer.

16. The method of claim 14, wherein the AP-coupling layer is nonmagnetic and the free sublayers are antiparallel to each other.

17. The method of claim 14, further comprising forming an insulating layer between the hard bias material and the sublayers.

18. The method of claim 14, comprising engaging a hard disk drive with the MTJ device.

19. The method of claim 14, comprising establishing a desired magnetic thickness by establishing a difference in thicknesses between the sublayers.

* * * * *